United States Patent
Bucchignano et al.

(10) Patent No.: US 7,695,897 B2
(45) Date of Patent: Apr. 13, 2010

(54) STRUCTURES AND METHODS FOR LOW-K OR ULTRA LOW-K INTERLAYER DIELECTRIC PATTERN TRANSFER

(75) Inventors: James J. Bucchignano, Yorktown Heights, NY (US); Gerald W. Gibson, Danbury, CT (US); Mary B. Rothwell, Ridgefield, CT (US); Roy R. Yu, Poughkeepsie, NY (US)

(73) Assignee: International Business Machines Corporation, Armonk, NY (US)

(*) Notice: Subject to any disclaimer, the term of this patent is extended or adjusted under 35 U.S.C. 154(b) by 290 days.

(21) Appl. No.: 11/429,709

(22) Filed: May 8, 2006

(65) Prior Publication Data

US 2007/0259291 A1    Nov. 8, 2007

(51) Int. Cl.
G03F 7/00 (2006.01)
G03F 7/26 (2006.01)

(52) U.S. Cl. .................. 430/313; 430/323; 430/317; 430/316; 430/296; 216/72; 216/58

(58) Field of Classification Search .................. 430/313, 430/317, 316, 323; 216/72, 58
See application file for complete search history.

(56) References Cited

U.S. PATENT DOCUMENTS

| | | | |
|---|---|---|---|
| 5,980,979 A | 11/1999 | Rohner | |
| 6,724,069 B2 | 4/2004 | Dalton et al. | |
| 6,869,542 B2* | 3/2005 | Desphande et al. | 216/51 |
| 2002/0142610 A1* | 10/2002 | Chien et al. | 438/710 |
| 2003/0027418 A1* | 2/2003 | Aoki et al. | 438/637 |
| 2004/0178169 A1 | 9/2004 | Desphande et al. | |
| 2005/0023689 A1 | 2/2005 | Nicholson et al. | |
| 2005/0040532 A1 | 2/2005 | Kumar et al. | |
| 2005/0077628 A1* | 4/2005 | Kumar et al. | 257/758 |
| 2005/0184397 A1 | 8/2005 | Gates et al. | |
| 2005/0242414 A1 | 11/2005 | Angyal et al. | |
| 2005/0266681 A1 | 12/2005 | Dalton et al. | |

* cited by examiner

*Primary Examiner*—Kathleen Duda
*Assistant Examiner*—Caleen O Sullivan
(74) *Attorney, Agent, or Firm*—Scully, Scott, Murphy & Presser, P.C.; Louis J. Percello, Esq.

(57) ABSTRACT

The present invention relates to improved methods and structures for forming interconnect patterns in low-k or ultra low-k (i.e., having a dielectric constant ranging from about 1.5 to about 3.5) interlevel dielectric (ILD) materials. Specifically, reduced lithographic critical dimensions (CDs) (i.e., in comparison with target CDs) are initially used for forming a patterned resist layer with an increased thickness, which in turn allows use of a simple hard mask stack comprising a lower nitride mask layer and an upper oxide mask layer for subsequent pattern transfer. The hard mask stack is next patterned by a first reactive ion etching (RIE) process using an oxygen-containing chemistry to form hard mask openings with restored CDs that are substantially the same as the target CDs. The ILD materials are then patterned by a second RIE process using a nitrogen-containing chemistry to form the interconnect pattern with the target CDs.

18 Claims, 6 Drawing Sheets

STRUCTURES AND METHODS FOR LOW-K OR ULTRA LOW-K INTERLAYER DIELECTRIC PATTERN TRANSFER

FIELD OF THE INVENTION

The present invention generally relates to interconnect pattern formation in the sub-60 nm generations of semiconductor devices as addressed by the International Technology Roadmap for Semiconductor (ITRS), including the 45 nm node, the 33 nm node, and the 22 nm node devices. More specifically, the present invention relates to lithographic resist patterning and transfer of the resist pattern to a hard mask stack and then to a low-k (i.e., having a dielectric constant k ranging from about 2.2 to about 3.5) or ultra low-k (i.e., having a dielectric constant k below 2.4) interlevel dielectric structure for formation of at least one interconnect pattern within the dimensions mentioned hereinabove.

BACKGROUND OF THE INVENTION

In a conventional interconnect pattern formation process, a hard mask layer is first formed over the ILD layer in which an interconnect pattern is to be formed, and a photo- or electron beam-sensitive resist layer is then coated on top of the hard mask layer. The resist layer is imaged with photolithography or electron beam lithography, followed by developing the lithographic image into a corresponding pattern in the resist layer. Due to the collapsible nature of the organic resist layer during the image developing process, the aspect ratio of the resist pattern (i.e., thickness or height of the resist pattern verses its width) needs to be not more than about 2:1. For example, for 60 nm resist features, the maximum resist layer thickness is about 120 nm. Higher aspect ratio for the resist pattern is desirable for subsequent pattern transfer, i.e., a thicker resist layer provides more protection for the masked regions in the underlying layers, but it can lead to undesirable collapse in the resist layer during the image developing process.

Pattern transfer from the resist layer to the ILD layer typically involves two steps. First, the pattern is transferred from the resist layer into the hard mask layer. The hard mask layer performs dual functions, i.e., it maintains or enhances the aspect ratio of the pattern to be transferred at one hand, and on the other hand, it forms a stop layer for subsequent chemical mechanical polishing (CMP) of the metal wirings. Next, the pattern is transferred from the hard mask layer into the ILD layer.

The hard mask layer is employed during the pattern transfer process because the organic resist material is not suitable for direct image transfer into the ILD layer by RIE. Therefore, by first transferring the pattern from the resist layer to the hard mask layer in a chemical environment that is compatible with resist processing, specially selected chemicals that are not compatible with resist processing can subsequently be used for patterning the ILD layer, resulting in better image profile and improved aspect ratio for the metal wirings.

As complementary metal oxide semiconductor (CMOS) device scaling continues from 90 nm node and 65 nm node to 45 nm node and beyond, the overall interconnect dimension shrinks accordingly from 105 nm and 80 nm to 60 nm and below. The overall dimension reduction imposes significant limitations on the dimensions of the resist patterns.

On one hand, the overall dimension reduction in semiconductor devices leads not only to reduction in the line width of the interconnect patterns, but also to reduction in the line spacing between such interconnect patterns. For positive resists, the width of the resist pattern is determined by the line spacing between the interconnect patterns to be formed. Therefore, the overall dimension reduction in semiconductor devices causes reduction in the width of the resist patterns. However, as mentioned hereinabove, the aspect ratio of the resist pattern (i.e., thickness or height of the resist pattern verses its width) needs to be maintained at not more than about 2:1, in order to prevent resist pattern collapse during the image developing process. Thus, the resist thickness needs to be reduced correspondingly in the sub-60 nm node devices, in order to prevent structural collapse in the resist layer.

On the other hand, the patterned resist layer must have a sufficient thickness in order to provide effective mask for the underlying dielectric layers and to prevent the masked region of the underlying dielectric layers from being damaged during subsequent pattern transfer. Typically, the thicker the underlying dielectric layers, the longer the pattern transfer process takes, and the thicker the patterned resist has to be.

However, there are several non-scalable factors in the interconnect scaling that add to the thicknesses of the underlying dielectric layer(s). For example, different layers of interlevel dielectric (ILD) materials in the CMOS device structures are typically capped by interlevel capping layers. These interlevel capping layers function to maintain the structural, processing, and environmental integrity of the ILD layers, and they each have a layer thickness ranging from about 300 Å to about 500 Å, which is not scalable. For another example, the metal wirings in each ILD layer are typically formed over a metal liner, which provides good adhesion between the metal wirings and the ILD surface, prevents oxidation of the metal wirings and avoids diffusion of metal ions into the ILD material. The metal liner has a layer thickness ranging from about 100 Å to about 200 Å, which is also not scalable. For a further example, the metal wirings in each ILD layer need to be capped by an interconnect capping layer, which functions to seal the top surface of the metal wirings and concurrently form a bottom layer for subsequent deposition of additional layers thereabove. The interconnect capping layer typically has a layer thickness ranging from about 300 Å to about 500 Å that is further not scalable. Such non-scalable factors as illustrated hereinabove significantly limit possible reduction in the depth of the underlying dielectric layers. For successful transfer of the resist pattern onto such relatively thick underlying dielectric layers, the patterned resist must have a thickness sufficient to endure the prolonged pattern transfer process and to protect the masked regions of the underlying dielectric layers.

Such limitations, which are placed on the resist pattern thickness by the overall semiconductor dimension scaling on one hand and by the non-scalable factors in the dielectric depth on the other hand, in turn limit the possible choices of the hard mask structures that can be used for pattern transfer from the resist layer to the underlying ILD layers.

To accommodate the thickness limitations on the resist patterns, two hard mask structures have been conventionally used for forming the 90 nm node structures, which include the TaN-based metal hard mask (MHM) structure and the low temperature oxide-based (LTO-based) hard mask structure containing a near-frictionless carbon layer (typically referred to as NFC, which is a hydrogenated diamond-like carbon film that is commercially available from Japan Synthetic Rubber).

The TaN-based MHM structure contains a complex stack of layers that each performs a different function. First, a silicon-based anti-reflection coating (SiARC) layer is provided directly under the resist layer to absorb the lithographic light during the resist-imaging step and to prevent reflection of the light back into the resist layer. The SiARC layer further enhances adhesion between the TaN MHM layer and the resist layer. Second, a TaN layer with a high nitrogen content is provided under the SiARC layer as the metal hard mask layer, which also provides optical transparency for optical overlay. Third, a diamond-like carbon (DLC) layer is provided under the TaN layer as a CMP stop layer. Finally, an optional oxide layer can be formed above the ILD structure by a tetraethylorthosilicate (TEOS)-based process to provide an adhesion-enhancing layer for the TaN-based MHM structure and an oxygen barrier layer for the ILD structure.

In a typical TaN-based pattern transferring process, a resist layer is first applied onto the SiARC layer and then developed by photo- or electron beam-based lithography to form a desired pattern therein. The pattern in the resist layer is transferred to into the SiARC layer, the TaN MHM layer, and the DLC layer by RIE techniques. During the RIE process, the resist layer is consumed, and the SiARC/TaN-MHM/DLC stack is subsequently used as hard mask to transfer the pattern further into the ILD layer.

Pattern damage may occur during the pattern transfer from the SiARC/TaN-MHM/DLC hard mask stack to the ILD layer. Since the TaN MHM layer is not thick enough for protecting the masked region of the ILD layer during the RIE process, a highly polymerizable component (such as $CH_3F$) is added during the RIE process to prevent the TaN MHM layer from being eroded too soon. However, the polymer layer formed by such a polymerizable component accumulates on sidewalls of the pattern to be transferred, leading to significant reduction in the critical dimension (CD) of the transferred pattern as well as increased roughness on the surfaces of the transferred pattern. Typical CD reduction resulting from the TaN-based pattern transferring process may amount to about 25 nm. The CD reduction not only significantly reduces the useful size of metal wirings in the 90 nm node and 65 nm node devices, but also leads to complete pattern transfer failure for the 45 nm node devices.

A common approach in solving the CD reduction problem is to increase the line width for compensating the line width reduction occurred during the RIE process. However, the increased line width causes corresponding reduction in the line spacing for a given device density, and the reduced line spacing in turn leads to reduced resist width and increased resist aspect ratio. Consequently, this approach inevitably leads to resist collapse in 45 nm node devices or sub-45 nm node devices (where the device density is very high) and therefore cannot be a viable process remedy for such devices.

The LTO-based hard mask structure also contains a complex stack of layers, including, from top to the bottom, a SiARC layer for anti-reflection and adhesion-enhancement, a LTO hard mask layer, and a NFC secondary pattern transfer layer. In a typical LTO-based pattern transferring process, a resist layer is applied onto the SiARC layer and developed by photo- or electron beam-based lithography to form a desired pattern therein. The pattern in the resist layer is then transferred to into the SiARC layer and the LTO hard mask layer by a first RIE step. Subsequently, the pattern is transferred to the NFC layer by a second RIE step.

The thickness of the NFC layer is chosen so that the combined thickness of the SiARC/LTO/NFC stack is sufficient to function as a hard mask to protect the masked region of the underlying ILD layer during the pattern transfer. Since the NFC secondary pattern transfer layer contains organic CH, its removal typically requires an oxygen-based RIE step. For dense ILD materials with medium to high dielectric constants (k), the LTO/NFC-based pattern transferring process is suitable because such dense ILD materials are resistant to oxygen-based RIE damages. However, when used with low-k or ultra low-k ILD materials, the LTO/NFC-based pattern transferring process may result in significant pattern damages (which can amount to a 25 nm increase in the critical dimension of the pattern transferred), because the low-k or ultra low-k ILD materials are particularly vulnerable to attacks by oxygen-based RIE.

There is therefore a continuing need for improved pattern transfer methods and improved hard mask stacks that can be used for transferring resist pattern into low-k or ultra low-k ILD materials.

SUMMARY OF THE INVENTION

The present invention provides a novel approach to fine pitch wiring pattern transfer. The initial critical dimensions (CDs) or line widths, as defined by the initial lithographic pattern, is provided in the present invention at about 10-15 nm smaller than the targeted CDs or line widths. The reduced CDs or line widths lead to increase in the line spacing, as well as increase in the widths of the resist pattern. Correspondingly, the thickness of the resist pattern can be increased significantly (e.g., for about 40%), without increasing the aspect ratio thereof. In other words, the vertical budget of the resist pattern is increased without increasing the risk of resist collapse. The total resist thickness gained by reducing the lithographic CDs allows the hard mask stack to be significantly simplified. Therefore, the present invention provides a novel hard mask stack, which includes only a lower nitride (or nitride-rich) mask layer and an upper oxide (or oxide-rich) mask layer, for transferring a lithographic pattern from the patterned resist layer to a low-k or ultra low-k interlevel dielectric structure. Such a simplified hard mask stack is particularly useful for transferring resist patterns into low-k or ultra low-k interlevel dielectric layers and for forming ultra-fine and ultra high-density wirings therein.

The initially reduced lithographic CDs can be regained during the subsequent hard mask opening process, in which an oxygen-containing etching chemistry is used for reactive ion etching (RIE) of the hard mask stack. The oxygen gas in the etching chemistry functions to increase the CDs or the line widths to substantially the same as the target CDs, and it also functions to achieve a lower edge roughness in the openings formed. The patterned resist layer is partially consumed during the hard mask opening process.

Subsequently, the low-k or ultra low-k ILD layer is opened during a subsequent RIE process, in which a nitrogen-containing etching chemistry is used to achieve a higher etching selectivity for the low-k or ultra low-k ILD material over the resist and the hard mask stack. The resist is fully consumed during the subsequent RIE process, and no further oxygen-based stripping is required for removing the resist. In this manner, the low-k or ultra low-k ILD layers are protected from potential oxygen damages. The RIE residue, which comprises primarily fragmented fluorocarbon, can be readily removed by an isopropylacohol (IPA)-based cleaning and rinsing step without causing any CD loss.

In summary, the present invention enables the use of a thicker resist layer, which provides better resist integrity and reduces the risk of resist collapse, and a simpler hard mask stack for transferring lithographic patterns into low-k or ultra low-k ILD layers, without reducing or otherwise compromising the CD of the final patterns formed in the low-k or ultra low-k ILD layers.

In one aspect, the present invention relates to a method for forming an interconnect pattern of target critical dimensions in an interlevel dielectric structure, comprising:

forming an interlevel dielectric (ILD) structure comprising one or more interlevel dielectric layers that each has a dielectric constant ranging from about 1.5 to about 3.5;

forming a hard mask stack over the ILD structure, wherein the hard mask stack comprises a lower nitride mask layer and an upper oxide mask layer;

forming a resist layer over the hard mask stack;

patterning the resist layer to form one or more resist openings having critical dimensions that are smaller than the target critical dimensions by about 5 nm to about 30 nm;

patterning the hard mask stack through the resist openings to form one or more hard mask openings, wherein the hard mask openings have the target critical dimensions; and patterning the ILD structure through the hard mask openings to form an interconnect pattern that is aligned with the hard mask openings and thereby also has the target critical dimensions.

The word "nitride" as used herein typically refers to silicon nitride ($SiN_x$) or nitrogen-rich silicon oxynitride ($SiN_xO_y$, with x>y) with or without other additives, unless otherwise specified. The word "oxide" as used herein typically refers to silicon oxide ($SiO_y$) or oxygen-rich silicon oxynitride ($SiN_xO_y$, with x<y) with or without other additives, unless otherwise specified.

Preferably, the hard mask stack is patterned by a first reactive ion etching (RIE) step that uses an oxygen-containing etching chemistry, and the ILD structure is patterned by a second RIE step that uses a nitrogen-containing etching chemistry. In a specific embodiment of the present invention, the first RIE step is carried out using an oxygen-containing etching chemistry, and the second RIE step is carried out using a nitrogen-containing etching chemistry. The patterned resist layer is partially consumed during the first RIE step, and then is completely consumed during the second RIE step. Therefore, no further oxygen-based resist stripping step is necessary after the interconnect pattern is formed in the ILD structure, and potential oxygen damage to the ILD structure can be avoided. The RIE etch residue can be readily removed from the interconnect pattern by using isopropylalcohol (IPA)-based cleaning and rinsing.

The resist layer is preferably patterned by using electron-beam lithography to form resist openings with the reduced critical dimensions. More preferably, the resist openings have critical dimensions that are about 10 nm to about 20 nm smaller than the target critical dimensions, which typically range from about 20 nm to about 60 nm. Correspondingly, a relatively thick resist layer (e.g., preferably having a thickness ranging from about 500 Å to about 2000 Å, and more preferably from about 1000 Å to about 1600 Å) can be used without increasing the risk of resist collapse.

Preferably, the lower nitride mask layer and the upper oxide mask layer each as a thickness ranging from about 100 Å to about 1000 Å, and more preferably from about 250 Å to about 500 Å.

The one or more interlevel dielectric layers may comprise low-k or ultra low-k dielectric materials having a dielectric constant ranging from about 1.5 to about 3.5. Preferably, the low-k or ultra low-k dielectric materials are selected from the group consisting of inorganic dielectric materials, C-doped oxides, F-doped oxides, fluorinated silica glass (FSG), dielectric polymers, organo-silicate materials, SiCOH-containing dielectric materials, spin-on dielectric materials, porous dielectric materials, non-porous dielectric materials, and mixtures or composites thereof. Preferably, but not necessarily, the one or more interlevel dielectric layers each comprise a spin-on organo-silicate ultra low-k dielectric material.

The interlevel dielectric structure of the present invention may further comprise one or more interlevel capping layers, each of which is located over one of the one or more interlevel dielectric layers and each having an etching selectivity of at least 10:1 over the interlevel dielectric layers. Preferably, but not necessarily, the interlevel capping layers each comprises one or more materials selected from the group consisting of organo silsesquioxanes, hydrido silsesquioxanes, hydrido-organo silsesquioxanes, siloxanes, silsesquioxanes, silicon carbides, and mixtures or composites thereof.

In another aspect, the present invention relates to a structure comprising a hard mask stack located over an interlevel dielectric (ILD) structure, wherein the ILD structure comprises one or more ILD layers that each has a dielectric constant ranging from about 1.5 to about 3.5, and wherein the hard mask stack comprises a lower nitride mask layer and an upper oxide mask layer.

Preferably, but not necessarily, the hard mask stack comprises one or more hard mask openings therein that extend through the lower nitride mask layer and the upper oxide mask layer, and wherein the hard mask openings have critical dimensions ranging from about 20 nm to about 60 nm.

More preferably, the structure further comprises a patterned resist layer located over the hard mask stack. The patterned resist layer may have a thickness ranging from about 500 Å to about 2000 Å, more preferably from about 1000 Å to about 1600 Å, and it may comprise one or more resist openings having critical dimensions that are from about 5 nm to about 30 nm smaller than those of the hard mask openings.

Further, the ILD structure comprises an interconnect pattern that is aligned with the hard mask openings and thereby also has critical dimensions ranging from about 20 nm to about 60 nm. In a specific embodiment of the present invention, the ILD structure comprises at least a first ILD layer located over a second ILD layer. The first ILD layer has one or more wider line openings that extend therethrough and are aligned to the hard mask openings, and the second ILD layer has one or more narrower via openings therein.

Other aspects, features and advantages of the invention will be more fully apparent from the ensuing disclosure and appended claims.

DETAILED DESCRIPTION OF THE INVENTION, AND PREFERRED EMBODIMENTS THEREOF

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The present invention provides a novel lithography and etch method that uses a simple hard mask stack structure that is particularly suitable for transferring lithographic resist pattern to a low-k or ultra low-k ILD structure in sub-45 nm node CMOS devices.

Figure 1:
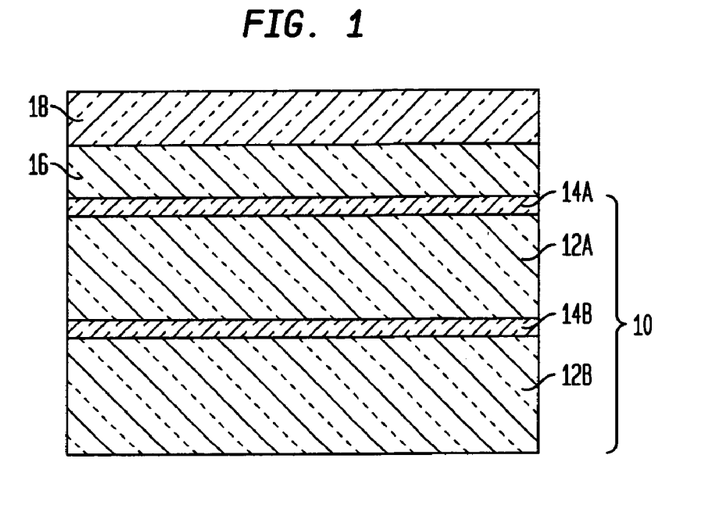
FIG. 1 shows a cross-sectional view of an oxide/nitride hard mask stack located over an interlevel dielectric structure, according to one embodiment of the present invention.

FIG. 1 shows a hard mask stack structure that comprises a lower nitride mask layer 16 and an upper oxide mask layer 18, which are formed over an ILD structure 10.

The lower nitride mask layer 16 comprises silicon nitride ($SiN_x$) or nitrogen-rich silicon oxynitride ($SiN_xO_y$, with x>y). The lower nitride mask layer 16 protects the ILD structure 10 from oxidation during deposition of the upper oxide layer 18. It also functions as a CMP stop layer during a subsequent CMP process. Preferably, the nitride mask layer 16 has a thickness ranging from about 100 Å to about 1000 Å, and more preferably from about 300 Å to about 700 Å. The nitride mask layer 16 can be readily deposited over the ILD structure 10 by a conventional nitride deposition process, such as physical vapor deposition (PVD), chemical vapor deposition (CVD), plasma enhanced chemical vapor deposition (PECVD), and chemical solution deposition.

The upper oxide mask layer 18 comprises silicon oxide ($SiO_y$) or oxygen-rich silicon oxynitride ($SiN_xO_y$, with x<y). The oxide mask layer 18 provides a good adhesion surface for the photo- or electron beam-sensitive resist layer (not shown) to be formed thereon, and it prevents the nitride in the lower nitride mask layer 16 from poisoning the resist. Preferably, the upper oxide mask layer 18 has a thickness ranging from about 100 Å to about 1000 Å, and more preferably from about 300 Å to about 700 Å. The upper oxide mask layer 18 can be readily deposited over the ILD structure 10 by a conventional nitride deposition process, such as physical vapor deposition (PVD), chemical vapor deposition (CVD), plasma enhanced chemical vapor deposition (PECVD), and chemical solution deposition.

The ILD structure 10 may comprise any number of ILD layers, with or without ILD capping layers. The specific embodiment as illustrated by FIG. 1 contains first and second ILD layers 12A and 12B and first and second ILD capping layers 14A and 14B. However, it is readily understood that the specific numbers of ILD layers and ILD capping layers as contained by the ILD structure 10 are not limited in any manner.

The first and second ILD layers 12A and 12B may comprise a low-k dielectric material having a dielectric constant ranging from about 2.2 to about 3.5, or an ultra low-k dielectric material having a dielectric constant ranging from about 1.5 to about 3.0.

In a preferred embodiment of the present invention, the first and second ILD layers 12A and 12B each comprises one or more ultra low-k dielectric materials, including, but not limited to: inorganic dielectrics, SiCOH-based dielectric compositions, C-doped oxides, F-doped oxides, fluorinated silicate glass (FSG), dielectric polymers, and organo-silicate materials. Such ultra low-k dielectric materials can be deposited by plasma enhanced chemical vapor deposition (PECVD) or by spin coating methods. Specific examples of PECVD ultra low-k dielectric materials include, but are not limited to: Black Diamond™ porous SiCOH (BDII, BDIII) from Applied Materials; Coral™ from Novellus Systems; and Aurora™ ULK and ELK from ASM. Specific examples of spin-coated ultra low-k dielectric material layers include, but are not limited to: spin-coated SiCOH materials such as methylsilsesquioxanes, siloxanes, and 5109, 5117, 5525, 5530 from Japan Synthetic Rubber (JSR). The materials known as Orion™ from Trikon Technologies and the materials known as Zircon™ from Shipley Company may also be used for forming the first and second ILD layers 12A and 12B. The spin-coated organo-silicate material known as 5109 from JSR is particularly preferred.

Alternatively, low-k organic dielectric materials, such as the commercially available porous or non-porous organic polymer-based low-k dielectric materials from Dow Chemical Co. under the tradenames SiLK™ or porous SiLK™, the GX-3T and GX-3p materials from Honeywell Electronic Materials, polyarylene ethers, and the like, can also be used for forming the first and second ILD layers 12A and 12B.

The thicknesses of the first and second ILD layers 12A and 12B may range from about 600 Å to about 5000 Å. Specific thicknesses of the first and second ILD layers 12A and 12B can be selected within such a broad range, according to the specific application requirements. Preferably, but not necessarily, the first and second ILD layers 12A and 12B each have a thickness ranging from about 500 Å to about 1000 Å, and more preferably from about 700 Å to about 900 Å.

The ILD capping layers 14A and 14B may be formed by one or more materials that provide an etch selectivity of at least 10:1 over the ILD layers 12A and 12B. Suitable materials include, but are not limited to: organo silsesquioxanes, hydrido silsesquioxanes, hydrido-organo silsesquioxanes, siloxanes, silsesquioxanes, silicon carbides, and mixtures or composites thereof. Commercially available materials that can be used for forming the ILD capping layers 14A and 14B include HOSP, HOSP BESt, AP6000, Ensemble, Etch Stop, Ensemble Hard Mask, etc.

Preferably, the ILD capping layers 14A and 14B comprise one or more materials selected from the group consisting of tetramethylcyclotetrasiloxane (TMCTS), octamethylcyclotetrasiloxane (OMCTS), derivatized cyclotrisiloxanes, derivatized cyclopentasiloxanes, ethyl substituted cyclic siloxanes, and derivatized siloxanes. More preferably, the ILD capping layers 14A and 14B comprise OMCTS.

The first and second ILD capping layers may each have a thickness ranging from about 50 Å to about 600 Å, more preferably from about 100 Å to about 500 Å, and most preferably from about 250 Å to about 350 Å.

Note that the ILD capping layers 14A and 14B are optional in the interlevel dielectric structures of the present invention. When the ILD layers 12A and 12B are formed by suitable materials that can survive CMP process without significant dishing effects, the interlevel dielectric structures of the present invention may be consisted essentially of the ILD layers without the capping layers.

The oxide/nitride hard mask stack provided by the present invention is a significantly simpler structure in comparison with the prior art TaN-based or LTO/NFC-based hard mask stack.

FIG. 2-6 illustrate exemplary steps of a single damascene process for forming a single level of metal interconnects in the interlevel dielectric structure by using the oxide/nitride hard mask stack shown in FIG. 1.

Figure 2:
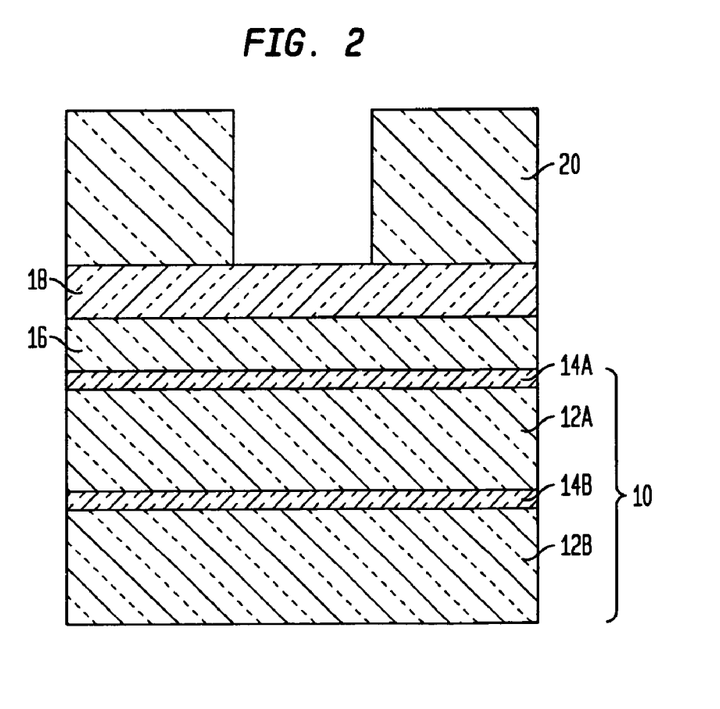
FIGS. 2-6 illustrate exemplary steps of a single damascene process for forming a single level of metal interconnects in the interlevel dielectric structure by using the oxide/nitride hard mask stack shown in FIG. 1.

Reference is first made to FIG. 2, which shows formation of a patterned resist layer 20 with one or more openings over an upper surface of the oxide mask layer 18. The patterned resist layer 20 is formed by first depositing a blanket layer of a photo- or electro beam-sensitive resist material over the upper surface of the oxide mask layer 18, followed by conventional photo- or electron beam-base lithography and resist development steps. Suitable photo- or electron beam-sensitive resist materials that can be used for forming the patterned resist layer 20 of the present invention are well known in the art and are therefore not described in detail herein. The resist layer 20 is preferably patterned to form resist openings with critical dimensions (CDs) that are smaller than the target CDs in the interconnect pattern to be formed, as shown in FIG. 2. The reduced CDs of the resist openings allows the resist layer 20 to have an increased thickness of about 40% than that of the conventional resist layer. Preferably, the resist layer 20 of the present invention has a thickness ranging from about 500 Å to about 2000 Å, and more preferably from about 1000 Å to about 1600 Å.

As a preferred example for the present invention for forming an interconnect pattern with a 50 nm line with a 100 nm pitch in an OMCT ILD structure that is typically used in 45 nm node devices, the oxide and nitride hard mask layers 18 and 16 are provided at a thickness of about 500 Å each. A low-k OMCT ILD 10 having a thickness of about 1200 Å is located under the oxide and nitride hard mask layers. An electron beam-sensitive resist material, preferably a KRS resist material (i.e., ketal resist system, which is a low-activation-energy chemically amplified resist material that is based on ketal-protected polyhydrooxystyrene and is sensitive to both deep ultra-violet and electron beam), is applied over the oxide and nitride hard mask layers to form the resist layer 20. The KRS resist material has sensitivity for both electron beam and deep ultra violet light and can be used to provide both medium resolution (>100 nm) and fine resolution (<100 nm) imaging in a single resist layer.

An electron beam is then used to pattern the KRS resist layer 20 to form resist patterns at a 35 nm line width and a 100 nm pitch. The KRS resist layer 20 preferably has a thickness of about 1600 Å, which is significantly thicker than the conventional maximum KRS resist thickness of about 1000 Å for a 50 nm line at 100 nm pitch. The conventional 1000 Å KRS resist is not sufficient for subsequent RIE patterning of the 1000 Å (500 oxide and 500 Å nitride) hard mask stack 18 and 16 and the 1200 Å OMCT ILD 10. However, when the resist lithographic CDs are reduced from 50 nm to 35 nm, as in the present invention, the KRS resist thickness can be increased to 1600 Å, providing sufficient thickness for the subsequent patterning of the hard mask 18 and 16 and the ILD 10.

Figure 3:
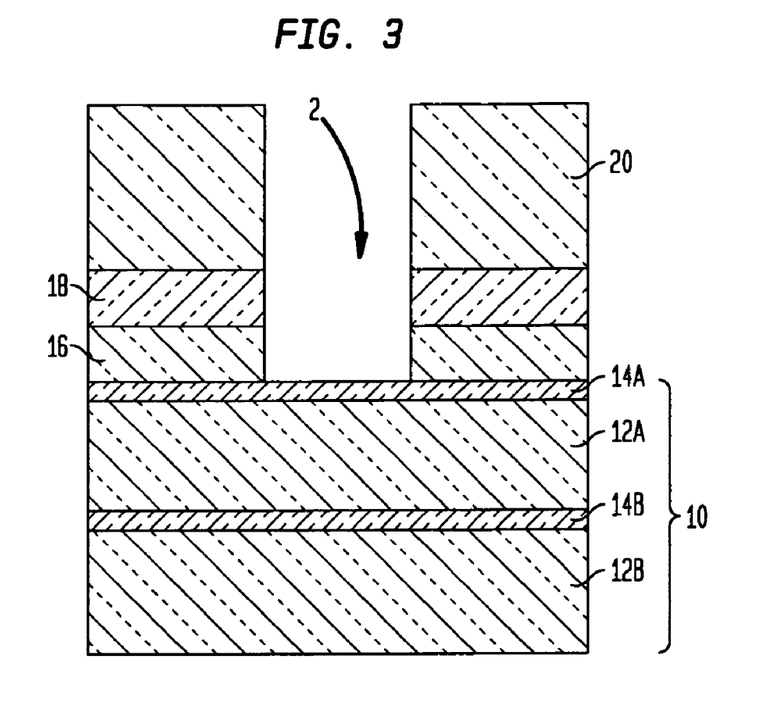

A first reactive ion etching (RIE) step is then carried out to form one or more hard mask openings 2 through the oxide mask layer 18 and the nitride mask layer 16, thereby exposing an upper surface of the first ILD capping layer 14A, as shown in FIG. 3. Preferably, but not necessarily, the first RIE step is carried out using an oxygen-containing etching chemistry.

As for the specific example described hereinabove, the 500 Å oxide and the 500 Å nitride hard mask layers 18 and 16 can be opened by a first reactive ion etching (RIE) step using a LAM 4250 XL tool with processing conditions at 200 W top power and 100 W bottom power and with the following process gas flows:

| | |
|---|---|
| $CHF_3$: | 20 sccm |
| $CF_4$: | 60 sccm |
| $O_2$: | 10 sccm |
| Ar: | balance. |

The oxygen gas functions to open the CDs of the hard mask openings 2 from 35 nm to 50 nm, thereby restoring the initially reduced lithographic CDs back to the target CDs.

Figure 4:
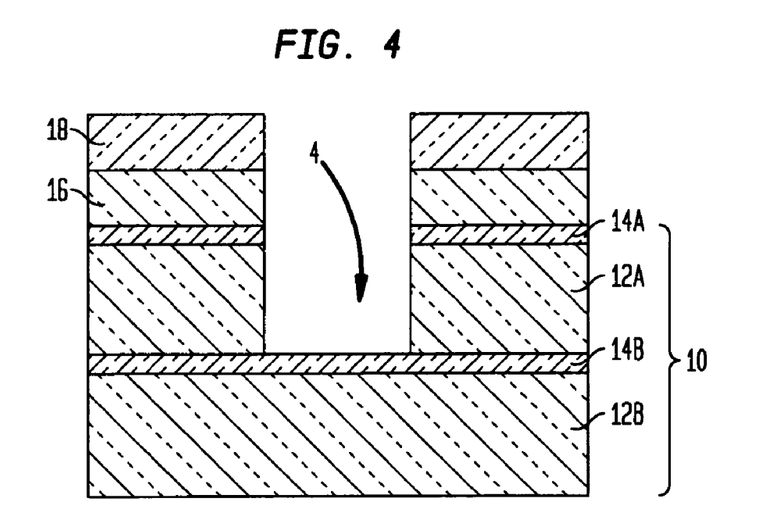

Subsequently, a second RIE step is carried out to form one or more openings 4 through the ILD structure 10, i.e., either in the first ILD layer 12A, as shown in FIG. 4, or in both the first and second ILD layers 12A and 12B. Preferably, the second RIE step is carried out using a nitrogen-etching chemistry.

As for the specific example described hereinabove, the 1200 Å ILD/OMCT structure 10 is opened by the second RIE step in the LAM 4250 XL tool with process conditions at 500 W top power and 400 W bottom power and with the following processing gas flows:

| | |
|---|---|
| $C_4F_8$: | 3 sccm |
| $CHF_3$: | 10 sccm, |
| $N_2$: | 100 sccm |
| $O_2$: | 8 ccm |
| Ar: | balance. |

The added 100 sccm of nitrogen gas during the second RIE step increases the RIE selectivity for the ILD structure 10 over the resist 20 and the hard mask layers 18 and 16. The KRS resist layer 20 is partially consumed during the first RIE step and is fully consumed during the second RIE step. Correspondingly, no additional oxygen-based resist stripping step is necessary for removing the KRS resist 20. Instead, an isopropylalcohol (IPA)-based solvent is used to rinse off the RIE residue. Therefore, potential oxygen damage to the ILD structure 10 can be prevented.

Further, only an upper portion of the oxide mask layer 18 is removed during the second RIE step, and a remaining oxide mask layer of sufficient thickness is still present after the second RIE step. In this manner, an additional resist layer can be formed on the remaining oxide mask layer for dual damascene processing of the ILD structure 10.

Optionally, a conductive liner or barrier layer (not shown) can be deposited on the exposed surfaces of the openings 4 in the first ILD layer 12A. This conductive liner may be formed using conventional deposition process such as, for example, chemical vapor deposition (CVD), physical vapor deposition (PVD), sputtering, plating, evaporation, or chemical solution deposition. The conductive liner may be a bilayer of a refractory metal nitride, such as, for example, tantalum nitride (TaN) and a refractory metal, such as, for example, tantalum (Ta). TiN, WN, W, Re, Ru, and similar metallic materials may also be used. Optionally, Si may be added to form a ternary metal alloy linear such as TiSiN.

Figure 5:
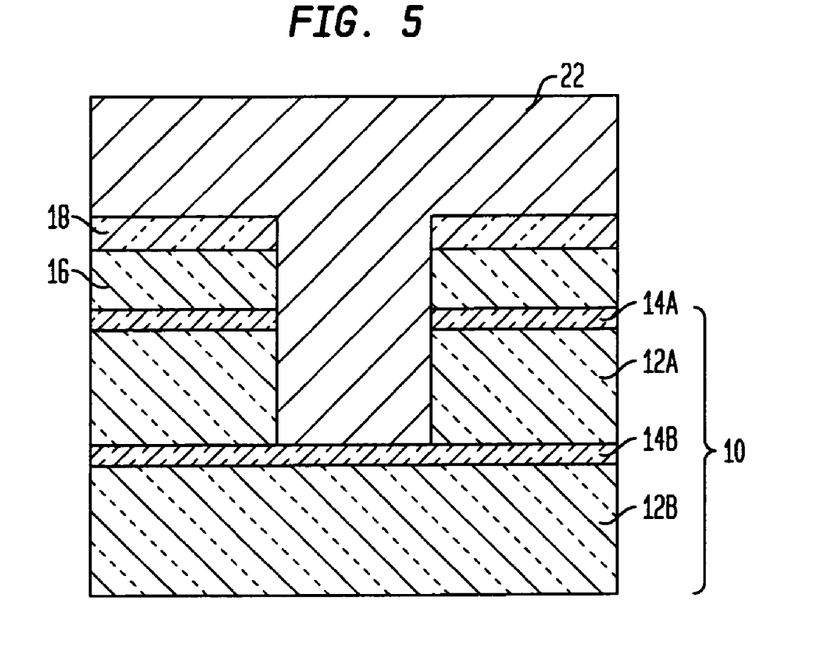
Figure 6:
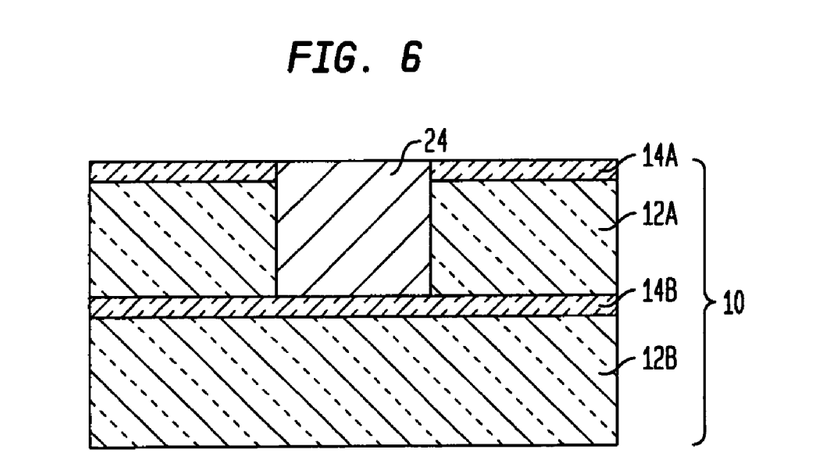

A blanket metallic material layer 22 is then deposited over the entire structure, as shown in FIG. 5, followed by planarization to remove the excessive metallic material and the oxide/nitride mask layers 18 and 16, thereby forming the metal interconnect 24 in the openings of the first ILD layer 12A, as shown in FIG. 6.

The metal interconnect 24 formed by the single damascene process illustrated by FIGS. 2-6 may include either a relatively wide metal line or a relatively narrow metal via. The metal interconnect layer 24 may comprise any suitable conductive material(s) selected from the group consisting of metals, metal alloys, metal silicides, and metal nitrides. Preferably, the metal interconnect layer 24 comprises one or more metal components that include, but are not limited to: W, Cu, Al, Ag, Au, and mixtures and alloys thereof. A highly preferred interconnect metal is Cu. Cu-based alloys, such as Cu—Ti and Cu—Sn alloys, can also be used.

Planarization of the blanket metallic layer 22 and removal of the oxide/nitride mask layers 18 and 16 are carried out using a conventional planarization process, such as the chemical mechanical polishing (CMP) process. After the planarization, an upper surface of the metal interconnect 24 is approximately coplanar with an upper surface of the first interlevel capping layer 14A, as shown in FIG. 6.

A diffusion barrier/etch stop layer (not shown) can subsequently be deposited over the upper surface of the interconnect 24 to complete the interconnect level. The diffusion barrier/etch stop layer may be comprised of any suitable insulating material that is capable of preventing diffusion of metal ions from the metal interconnect 24 into the next ILD layer to be formed thereover. Preferably, but not necessarily, the diffusion barrier/etch stop layer comprises an amorphous alloy selected from SiN, SiCN, and SiC, as well as the hydrogenated forms of such materials.

In another embodiment of the present invention, metal interconnects including both metal lines and metal vias are formed in different ILD layers by a dual damascene process, which is illustrated by FIGS. 7-11.

Figure 7:
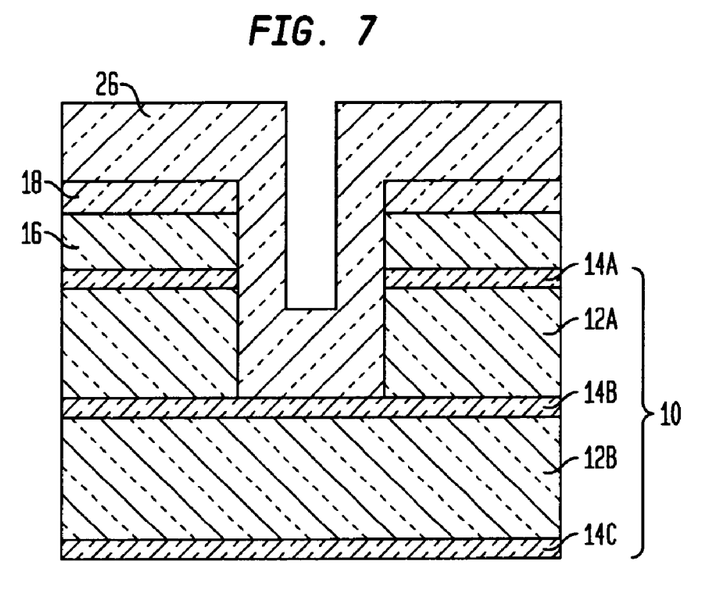
FIG. 7-11 illustrate exemplary steps of a dual damascene process for forming metal lines in an upper level and metal vias in a lower level in the interlevel dielectric structure by using the oxide/nitride hard mask stack shown in FIG. 1.
Figure 8:
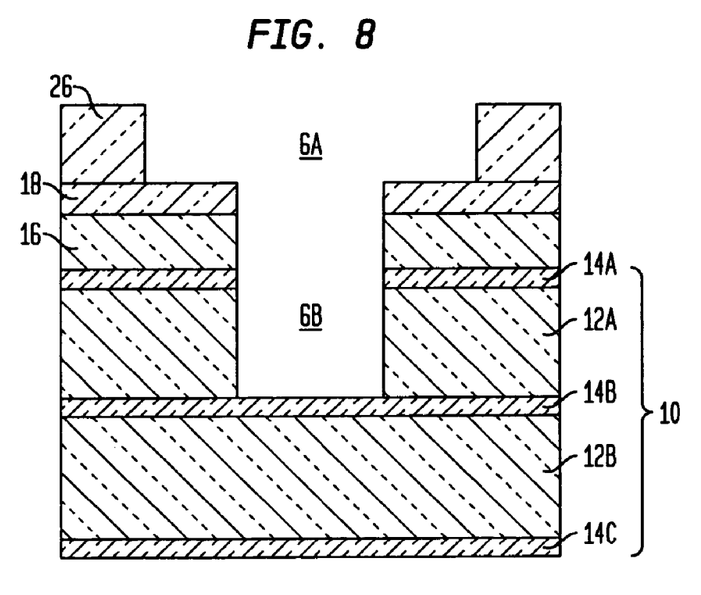

Specifically, after the second RIE step 3 in FIG. 4, an additional layer of photo- or electron beam-sensitive resist material 26 is deposited over the entire structure, as shown in FIG. 7. Conventional photo- or electron beam-based lithography and resist developing steps are then carried out to pattern the additional layer of resist material 26 and define a relatively wider line opening 6A therein, in distinction from the relatively narrower via opening 6B as previously defined by the patterned first resist layer 20, as shown in FIG. 8.

Figure 9:
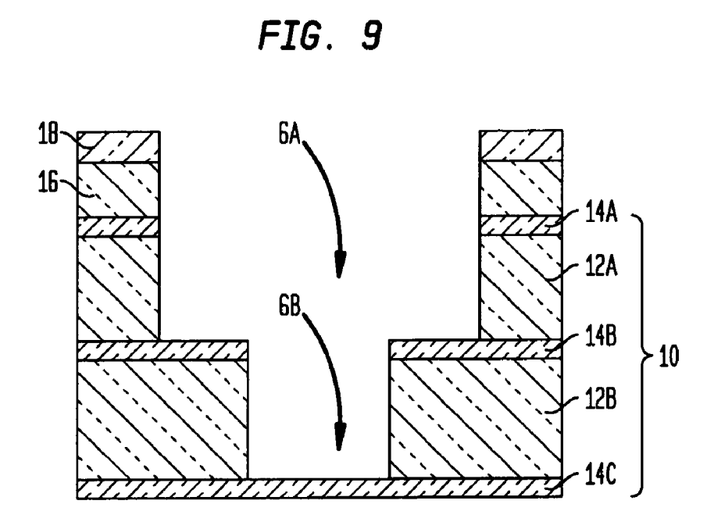

A third RIE step is preferably carried out to extend both the line opening 6A and the via opening 6B. Therefore, the line opening 6A extends downward through the oxide/nitride mask layers 18 and 16, the optional first ILD capping layer 14A, and the first ILD layer 12A, and the via opening 6B extends downward through the optional second ILD capping layer 14B and the second ILD layer 14B and stops on the underlying ILD capping layer 14C, as shown in FIG. 9. When the ILD structure 10 does not contain any ILD capping layers, via opening 6B then stops on an additional ILD layer (not shown) underlying the second ILD layer 12B. The third RIE step further consumes the additional resist layer 26 and at least a portion of the oxide mask layer 18, resulting in the structure shown by FIG. 10.

Figure 10:
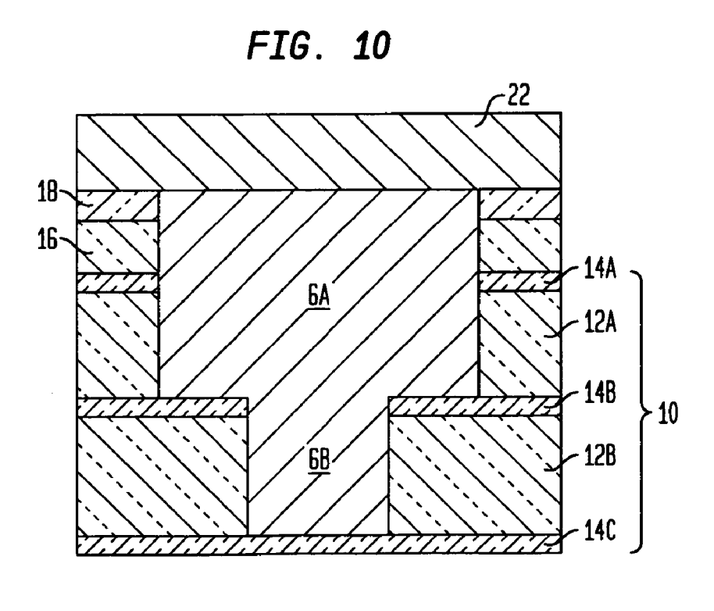
Figure 11:
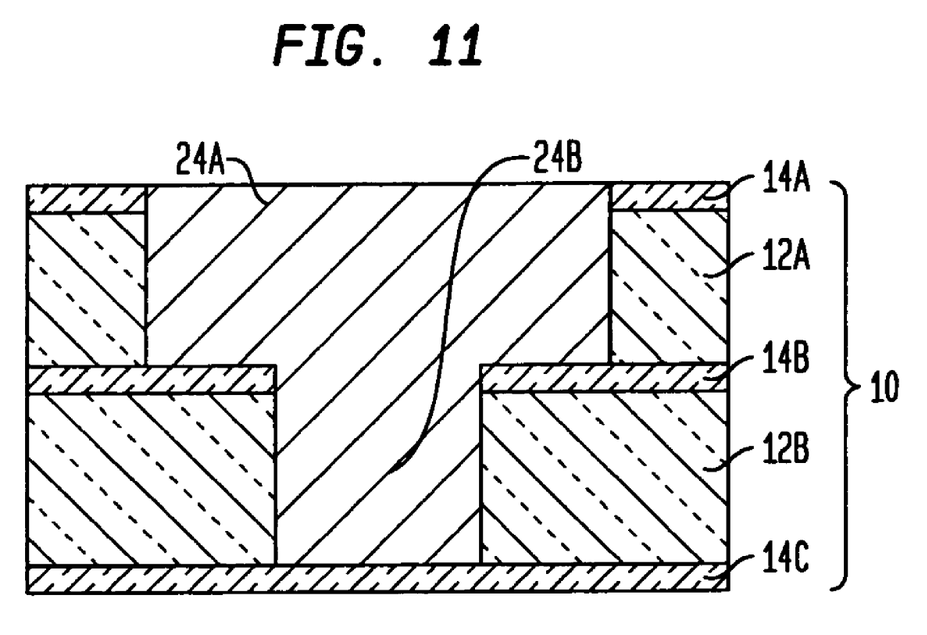

Metal deposition and planarization steps are then carried out, as shown in FIGS. 10 and 11, to form a relatively wide metal line 24A in the first ILD layer 12A and a relatively narrow metal via 24B in the second ILD layer 12B. The metal line and metal via 24A and 24B may be comprised of the same or different conductive material(s) selected from the group consisting of metals, metal alloys, metal silicides, and metal nitrides. Preferably, the metal line and metal via 24A and 24B comprise one or more metal components that include, but are not limited to: W, Cu, Al, Ag, Au, and mixtures and alloys thereof. A highly preferred interconnect metal is Cu. Cu-based alloys, such as Cu—Ti and Cu—Sn alloys, can also be used. A diffusion barrier/etch stop layer (not shown) can also be deposited over the upper surface of the metal line 24A to complete the interconnect level.

While FIGS. 1-11 illustratively demonstrates several exemplary hard mask structures and exemplary processing steps that use such exemplary hard mask structures to form interconnect patterns in the ILD layers, according to specific embodiments of the present invention, it is clear that a person ordinarily skilled in the art can readily modify such hard mask structures as well as the processing steps for adaptation to specific application requirements, consistent with the above descriptions. For example, while a single oxide mask layer and a single nitride mask layer are illustrated in the hard mask stack hereinabove, it is clear that a person ordinarily skilled in the art can readily modify such hard mask stack to provide additional oxide/nitride mask layers or other material layers, if desired. It should therefore be recognized that the present invention is not limited to the specific embodiments illustrated hereinabove, but rather extends in utility to any other modification, variation, application, and embodiment, and accordingly all such other modifications, variations, applications, and embodiments are to be regarded as being within the spirit and scope of the invention.

What is claimed is:

1. A method for forming an interconnect pattern of target critical dimensions in a dual damascene interlevel dielectric structure, comprising:

forming a dual damascene interlevel dielectric structure comprising one or more interlevel dielectric layers that each has a dielectric constant ranging from about 1.5 to about 3.5 and one or more interlevel capping layers each located over one of the one or more interlevel dielectric layers and each having an etching selectivity of at least 10:1 over the interlevel dielectric layers, said one or more interlevel dielectric layers each comprises one or more materials selected from the group consisting of inorganic dielectric materials, C-doped oxides, F-doped oxides, fluorinated silica glass (FSG), dielectric polymers, organo-silicate materials, SiCOH-containing dielectric materials, spin-on dielectric materials, porous dielectric materials, non-porous dielectric materials, and mixtures or composites thereof, and said one or more interlevel capping layers each comprises one or more materials selected from the group consisting of organo silsesquioxanes, hydrido silsesquioxanes, hydrido-organo silsesquioxanes, siloxanes, silsesquioxanes, silicon carbides, and mixtures or composites thereof;

forming a hard mask stack over the dual damascene interlevel dielectric structure, wherein said hard mask stack comprises a lower nitride mask layer and an upper oxide mask layer, wherein the lower nitride mask layer and the upper oxide mask layer each has a thickness ranging from about 300 Å to about 700 Å;

forming a resist layer having a thickness ranging from about 500 Å to about 2000 Å over the hard mask stack;

patterning the resist layer to form one or more resist openings having critical dimensions that are smaller than the target critical dimensions by about 10 nm to about 20 nm and said target critical dimensions are from about 20 to about 60 nm;

patterning the hard mask stack through the resist openings to form one or more hard mask openings, wherein the hard mask openings have the target critical dimensions; and patterning the dual damascene interlevel dielectric structure through the hard mask openings to form an interconnect pattern that is aligned with the hard mask openings and thereby also has the target critical dimensions, wherein the hard mask stack is patterned by a first reactive ion etching (RIE) step that uses a first gas mixture that consists of $CHF_3$, $CF_4$, $O_2$ and Ar and the dual damascene interlevel dielectric structure is patterned by a second RIE step that uses a second gas mixture that consists of $C_4F_8$, $CHF_3$, $N_2$, $O_2$ and Ar, and wherein the patterned resist layer is partially consumed during the first RIE step and is completely consumed during the second RIE step and further wherein only an upper portion of the upper oxide mask layer of the hard mask stack is removed during the second RIE step.

2. A method for forming an interconnect pattern of target critical dimensions in an interlevel dielectric structure, comprising:

forming an interlevel dielectric structure comprising one or more interlevel dielectric layers that each has a dielectric constant ranging from about 1.5 to about 3.5;

forming a hard mask stack over the interlevel dielectric structure, wherein said hard mask stack comprises a lower nitride mask layer and an upper oxide mask layer;

forming a resist layer over the hard mask stack;

patterning the resist layer to form one or more resist openings having critical dimensions that are smaller than the target critical dimensions by about 5 nm to about 30 nm;

patterning the hard mask stack through the resist openings to form one or more hard mask openings, wherein the hard mask openings have the target critical dimensions and said patterning the hard mask stack includes a first reactive ion etching (RIE) step that utilizes a first gas mixture that consists of $CHF_3$, $CF_4$, $O_2$ and Ar; and patterning the interlevel dielectric structure through the hard mask openings to form an interconnect pattern that is aligned with the hard mask openings and thereby also has the target critical dimensions, wherein the patterning of the interlevel dielectric structure includes a second RIE step that utilizes a second gas mixture that consists of $C_4F_8$, $CHF_3$, $N_2$, $O_2$ and Ar.

3. The method of claim 2, wherein the patterned resist layer is partially consumed during the first RIE step and is completely consumed during the second RIE step.

4. The method of claim 3, wherein only an upper portion of the upper oxide mask layer of the hard mask stack is removed during the second RIE step.

5. The method of claim 2, further comprising removing RIE residue by using isopropylalcohol (IPA)-based cleaning and rinsing.

6. The method of claim 2, wherein the resist layer is patterned by using electron-beam lithography.

7. The method of claim 2, wherein the critical dimensions of the resist openings are smaller than the target critical dimensions by about 10 nm to about 20 nm.

8. The method of claim 2, wherein the target critical dimensions ranges from about 20 nm to about 60 nm.

9. The method of claim 2, wherein the resist layer has a thickness ranging from about 500 Å to about 2000 Å.

10. The method of claim 2, wherein the lower nitride mask layer and the upper oxide mask layer each has a thickness ranging from about 100 Å to about 1000 Å.

11. The method of claim 2, wherein the lower nitride mask layer and the upper oxide mask layer each has a thickness ranging from about 300 Å to about 700 Å.

12. The method of claim 2, wherein the one or more interlevel dielectric layers in the interlevel dielectric structure each comprises one or more materials selected from the group consisting of inorganic dielectric materials, C-doped oxides, F-doped oxides, fluorinated silica glass (FSG), dielectric polymers, organo-silicate materials, SiCOH-containing dielectric materials, spin-on dielectric materials, porous dielectric materials, non-porous dielectric materials, and mixtures or composites thereof.

13. The method of claim 2, wherein the interlevel dielectric structure further comprises one or more interlevel capping layers each located over one of the one or more interlevel dielectric layers and each having an etching selectivity of at least 10:1 over the interlevel dielectric layers.

14. The method of claim 13, wherein said one or more interlevel capping layers each comprises one or more materials selected from the group consisting of organo silsesquioxanes, hydrido silsesquioxanes, hydrido-organo silsesqujoxanes, siloxanes, silsesquioxanes, silicon carbides, and mixtures or composites thereof.

15. The method of claim 2, further comprising filling the interconnect pattern in the interlevel dielectric structure with a metallic material followed by planarization to form a metal interconnect in the interlevel dielectric structure.

16. The method of claim 2, wherein the interlevel dielectric structure comprises at least a first interlevel dielectric layer located over a second interlevel dielectric layer, and wherein patterning of the interlevel dielectric structure comprises a dual damascene process that forms one or more wider line openings in the first interlevel dielectric layer and one or more narrower via openings in the second interlevel dielectric layer.

17. The method of claim 16, wherein the dual damascene process comprises:

patterning the first interlevel dielectric layer through the hard mask openings to form one or more narrower via openings that extend through the first interlevel dielectric layer;

forming an additional resist layer over the hard mask stack and the one or more narrower via openings in the first interlevel dielectric layer;

patterning the additional resist layer to form one or more wider line openings extending through the additional resist layer; and extending both the narrower via openings and the wider line openings by etching, wherein the narrower via openings extends downward through the second interlevel dielectric layer, and wherein the wider line openings extends downward though the hard mask stack and the first interlevel dielectric layer.

18. The method of claim 16, further comprising filling the one or more wider line openings in the first interlevel dielectric layer and the one or more narrower via openings in the second interlevel dielectric layer with a metallic material followed by planarization to form metallic lines in the first interlevel dielectric layer and metallic vias in the second interlevel dielectric layer.

* * * * *